United States Patent
Murdock

(10) Patent No.: US 9,911,678 B2
(45) Date of Patent: Mar. 6, 2018

(54) SUBSTRATE WITH INTEGRATED HEAT SPREADER

(71) Applicant: Qorvo US, Inc., Greensboro, NC (US)

(72) Inventor: Dylan Murdock, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/295,005

(22) Filed: Oct. 17, 2016

(65) Prior Publication Data
US 2017/0358515 A1 Dec. 14, 2017

Related U.S. Application Data

(60) Provisional application No. 62/349,178, filed on Jun. 13, 2016.

(51) Int. Cl.
| | |
|---|---|
| *H01L 23/34* | (2006.01) |
| *H01L 23/367* | (2006.01) |
| *H01L 23/498* | (2006.01) |
| *H01L 23/00* | (2006.01) |
| H01L 23/373 | (2006.01) |

(52) U.S. Cl.
CPC .... *H01L 23/3675* (2013.01); *H01L 23/49833* (2013.01); *H01L 23/49838* (2013.01); *H01L 24/17* (2013.01); *H01L 24/49* (2013.01); *H01L 23/3731* (2013.01); *H01L 23/3736* (2013.01); *H01L 2224/16227* (2013.01); *H01L 2224/16245* (2013.01); *H01L 2224/32245* (2013.01); *H01L 2224/48091* (2013.01); *H01L 2224/48106* (2013.01); *H01L 2224/48227* (2013.01); *H01L 2224/73265* (2013.01); *H01L 2924/1515* (2013.01); *H01L 2924/15747* (2013.01)

(58) Field of Classification Search
CPC .................................................. H01L 23/3736
USPC .......................................................... 257/707
See application file for complete search history.

(56) References Cited

U.S. PATENT DOCUMENTS

| | | | |
|---|---|---|---|
| 6,861,750 B2 * | 3/2005 | Zhao | H01L 23/3677 257/666 |
| 6,906,414 B2 * | 6/2005 | Zhao | H01L 23/13 257/707 |
| 7,786,567 B2 * | 8/2010 | Wang | H01L 23/3121 257/693 |

* cited by examiner

*Primary Examiner* — Chandra Chaudhari

(74) *Attorney, Agent, or Firm* — Withrow & Terranova, P.L.L.C.

(57) ABSTRACT

The present disclosure relates to a substrate with an integrated heat spreader. The disclosed substrate includes a substrate core, at least one connecting structure, and a heat spreader. The substrate core has a top surface and a bottom surface opposite the top surface of the substrate. The at least one connecting structure extends through the substrate core from the top surface of the substrate core to the bottom surface of the substrate core. And the heat spreader extends through the substrate core from the top surface of the substrate core to a bottom level that is below the bottom surface of the substrate core.

22 Claims, 5 Drawing Sheets

SUBSTRATE WITH INTEGRATED HEAT SPREADER

RELATED APPLICATIONS

This application claims the benefit of provisional patent application Ser. No. 62/349,178, filed Jun. 13, 2016, the disclosure of which is hereby incorporated herein by reference in its entirety.

FIELD OF THE DISCLOSURE

The present disclosure relates to a substrate with enhanced thermal performance, and more particularly to a substrate with an integrated heat spreader.

BACKGROUND

At an ever increasing rate, high speed and high performance transistors are more densely integrated in semiconductor dies. The amount of heat generated by the semiconductor dies increases significantly due to the growth in number of transistors per semiconductor die, the large amount of power passing through the transistors, and the high operation speed of the transistors. If the heat generated by the semiconductor dies cannot be dissipated efficiently, the semiconductor dies may fail to operate or have a degraded operating performance. Accordingly, heat dissipation is an issue in densely integrated semiconductor dies, and efficient heat dissipation is highly desirable.

Semiconductor dies normally reside in or on a substrate and the substrate will affect the semiconductor dies performance in many ways. For instance, the heat produced by the semiconductor dies could be conducted away from their immediate vicinity through the substrate. Laminate materials are widely used in substrates, which are inexpensive and have a mature supply-base within the industry. However, the laminate materials have poor thermal properties. A heat spreader integrated in the substrate is now widely used to enhance the thermal conductivity of the substrate.

FIG. 1 shows a system 10 including a conventional substrate 12. The substrate 12 includes a substrate core 14, connecting structures 16, and a heat spreader structure 18. The substrate core 14 has a top surface and a bottom surface opposite the top surface of the substrate core 14. Each connecting structure 16 extends through the substrate core 14 from the top surface of the substrate core 14 to the bottom surface of the substrate core 14. The heat spreader structure 18 includes a top heat plate 20 residing over a portion of the top surface of the substrate core 14, a bottom heat plate 22 residing over a portion of the bottom surface of the substrate core 14, and a heat spreader 24 extending through the substrate core 14. The heat spreader 24 is in contact with both the top heat plate 20 and the bottom heat plate 22, and coupled to the substrate core 14 via an adhesive 26.

The system 10 also includes a wire-bonding die 28, a printed circuit board (PCB) 30, and a system heat sink 32. The wire-bonding die 28, which includes a wire-bonding die body 34 and wires 36, is attached to the substrate 12. The wire-bonding die body 34 has a top surface and a bottom surface that is opposite the top surface of the wire-bonding die body 34 and coupled to the heat spreader structure 18. Each wire 36 extends from the top surface of the wire-bonding die body 34 towards a corresponding connecting structure 16.

In addition, the PCB 30 is mounted over a portion of the system heat sink 32. In order to connect the connecting structure 16 with the PCB 30 and connect the bottom heat plate 22 with the system heat sink 32 simultaneously, the system heat sink 32 must have a pedestal 38, which extends through the PCB 30, such that a top surface of the pedestal 38 is coplanar with a top surface of the PCB 30. The top surface of the pedestal 38 is in contact with the bottom heat plate 22 and the top surface of the PCB 30 is in contact with the connecting structure 16.

However, forming the pedestal 38 as described above is not cost efficient. Instead, the system heat sink 32 must be machined from an excessively thick starting system heat sink precursor (not shown) in order to form the pedestal 38, which is directly connected to the bottom heat plate 22. The process to form the pedestal 38 is generally expensive and wasteful as well as increases dimensional uncertainty of the layout.

Accordingly, to accommodate the increased heat generation of densely integrated semiconductor dies and reduce the cost of the system heat sink assembly, there remains a need for improved substrate designs. The substrate design will be easily fabricated without increasing the product size.

SUMMARY

The present disclosure relates to a substrate with an integrated heat spreader. The disclosed substrate includes a substrate core, at least one connecting structure, and a heat spreader. The substrate core has a top surface and a bottom surface opposite the top surface of the substrate core. The at least one connecting structure extends through the substrate core from the top surface of the substrate core to the bottom surface of the substrate core. And the heat spreader extends through the substrate core from the top surface of the substrate core to a bottom level that is below the bottom surface of the substrate core.

According to one embodiment, a substrate with an integrated heat spreader is included in a system. The system also includes a system heat sink, which has a top surface including a first surface portion and a second surface portion, and a printed circuit board (PCB) mounted over the first surface portion of the system heat sink. The disclosed substrate includes a substrate core, at least one connecting structure, and a heat spreader. The substrate core has a top surface and a bottom surface opposite the top surface of the substrate core. The at least one connecting structure extends through the substrate core from the top surface of the substrate core to the bottom surface of the substrate core. And the heat spreader extends through the substrate core and into an opening in the PCB. Herein, the heat spreader is thermally coupled to the second surface portion of the system heat sink such that a least a portion of the PCB resides between the bottom surface of the substrate core and the first surface portion of the system heat sink. In addition, the system further includes a die mounted over and thermally coupled to the heat spreader.

In one embodiment of the system heat sink, the first surface portion of the system heat sink and the second surface portion of the system heat sink are coplanar. The system heat sink is formed from a flat metal plate/sheet or a ceramic plate/sheet.

In another embodiment of the system heat sink, the first surface portion of the system heat sink resides along a first plane and the second surface portion of the system heat sink resides along a second plane that is different from the first plane.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
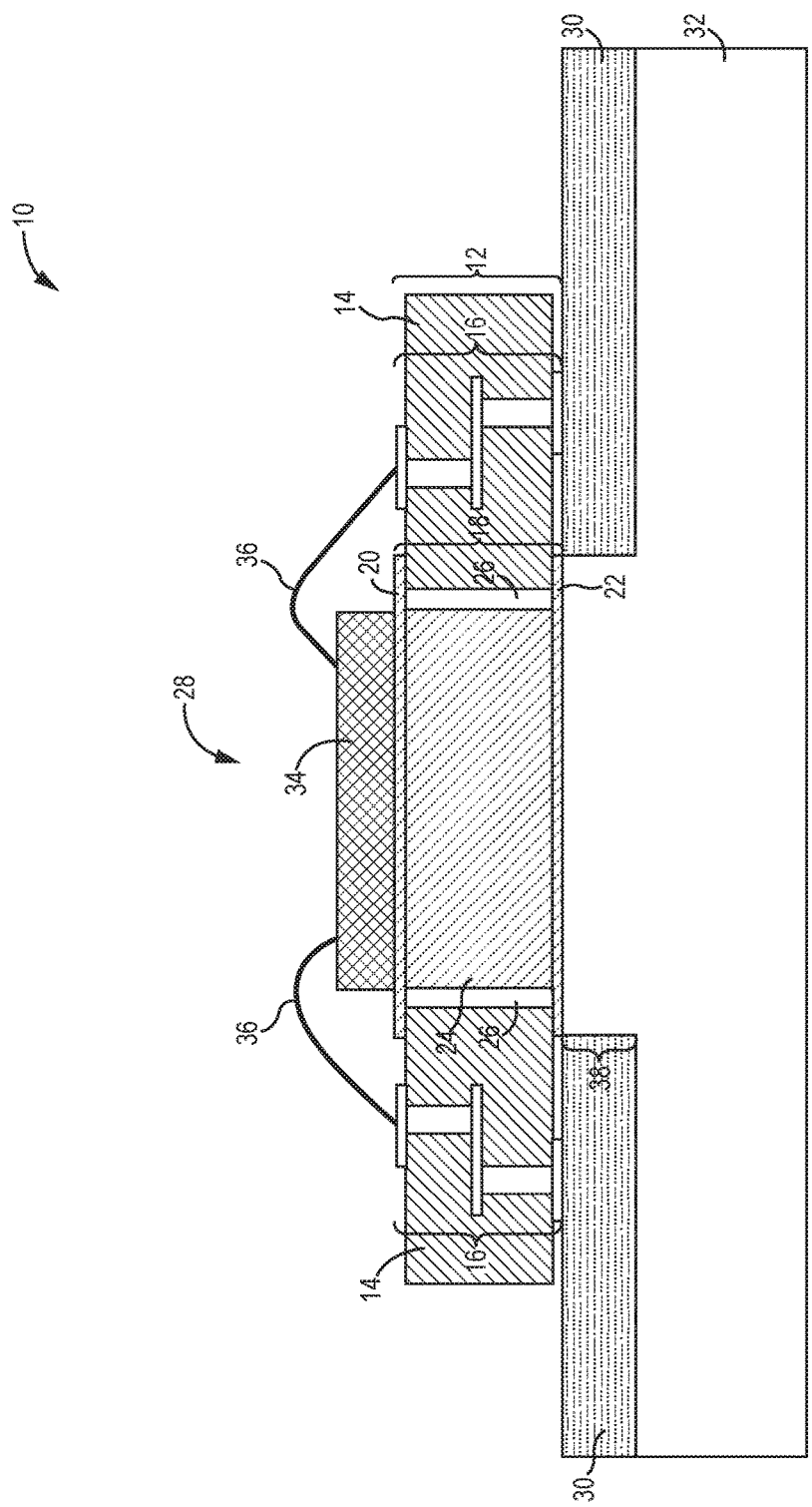
FIG. 1 shows a system including a conventional substrate.

It will be understood that for clear illustrations, FIGS. 1-4 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the FIGS. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
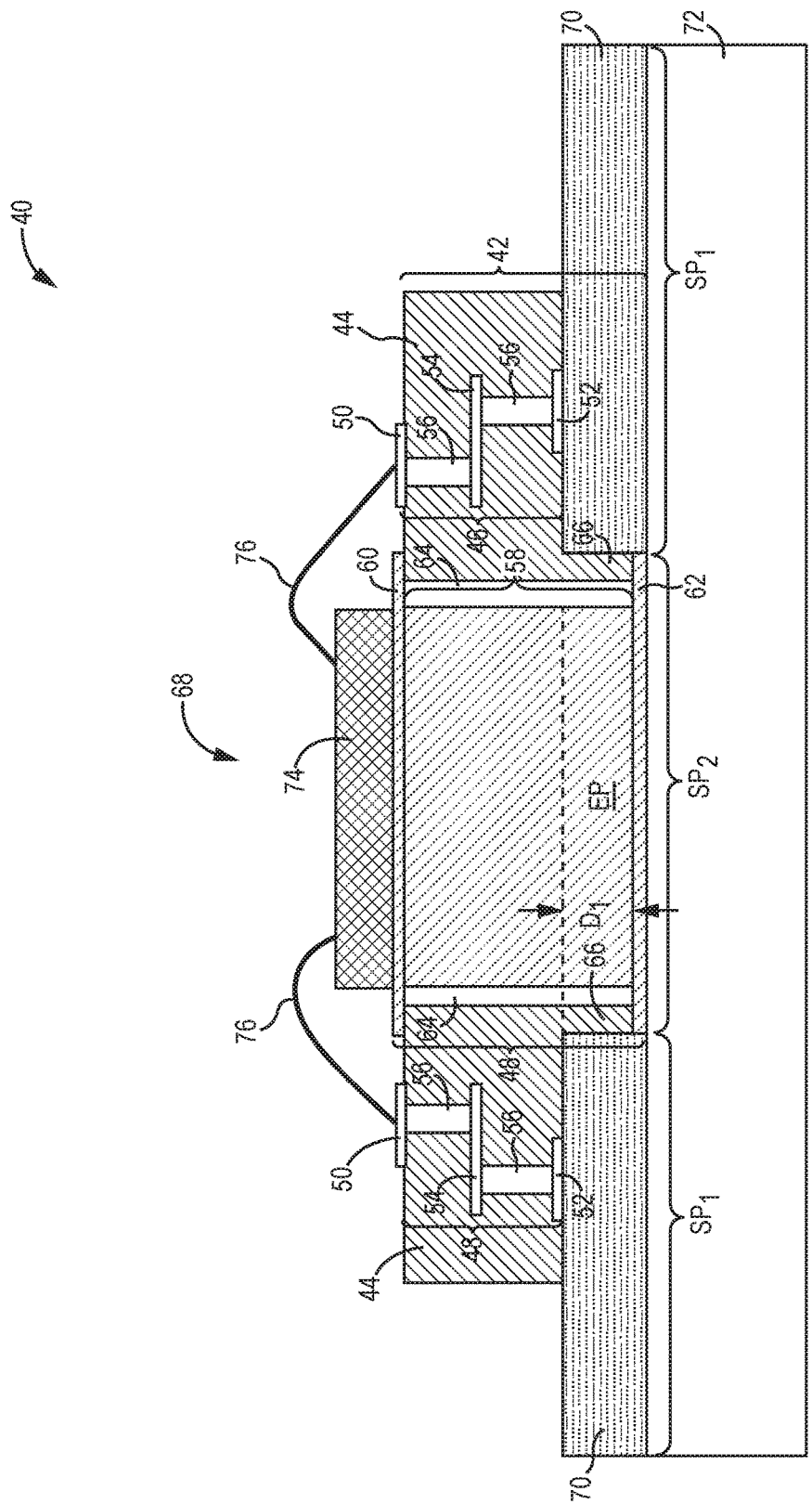
FIG. 2 shows a system including an exemplary substrate according to one embodiment of the present disclosure.

FIG. 2 provides a system 40 including an exemplary substrate 42 according to one embodiment of the present disclosure. For the purpose of this illustration, the substrate 42 includes a substrate core 44, two connecting structures 46, and a heat spreader structure 48. In different applications, the substrate 42 may include fewer or more connecting structures 46 and multiple heat spreader structures 48.

In detail, the substrate core 44 has a top surface and a bottom surface opposite the top surface of the substrate core 44 and may be formed from an organic material such as flame retardant 4 (FR4). The connecting structures 46 may be formed from copper and extend through the substrate core 44 from the top surface of the substrate core 44 to the bottom surface of the substrate core 44. Each connecting structure 46 may include a top pad 50 that resides over the top surface of the substrate core 44, a bottom pad 52 that is exposed at the bottom surface of the substrate core 44, at least one metal layer 54 integrated in the substrate core 44, and a number of vias 56 connecting the top pad 50, the at least one metal layer 54, and the bottom pad 52. In some applications, the connecting structure 46 may not include the at least one metal layer 54, such that the vias 56 are directly connecting the top pad 50 and the bottom pad 52.

In addition, the heat spreader structure 48 includes a heat spreader 58, a top heat plate 60, and a bottom heat plate 62. The heat spreader 58 extends through the substrate core 44 from the top surface of the substrate core 44 to a bottom level that is below the bottom surface of the substrate core 44. An extension portion EP of the heat spreader 58 extends below the bottom surface of the substrate core 44 by a distance D1 between 0.01 cm and 0.4 cm. The heat spreader 58 may be coupled to the substrate core 44 via adhesive 64. In different applications, the adhesive 64 may be absent and the heat spreader 58 may be directly coupled to the substrate core 44. The heat spreader 58 may be applied into the substrate core 44 by press fitting, sintering, or plating.

In this embodiment, the heat spreader 58 is a rectangular block, but other shapes may also apply. A top side of the heat spreader 58 and a bottom side of the heat spreader 58, which is opposite the top side of the heat spreader 58, may have the same or different size/shape. The top heat plate 60 is coupled to the top side of the heat spreader 58. In some applications, the top heat plate 60 may cover the top side of the heat spreader 58 and a least a portion of the top surface of the substrate core 44. In other cases, the top heat plate 60 may be confined within the top side of the heat spreader 58 (not shown). Similarly, the bottom heat plate 62 is coupled to the bottom side of the heat spreader 58. The heat spreader 58, the top heat plate 60, and the bottom heat plate 62 may be formed from metallic or ceramic materials, such as copper.

The substrate 42 may further include a core extension 66 that extends from the bottom surface of the substrate core 44 toward the bottom level and surrounds the extension portion EP of the heat spreader 58. The core extension 66 is surrounded by the bottom surface of the substrate core 44 and does not cover the connecting structures 46. In some applications, the bottom heat plate 62 may cover the bottom side of the heat spreader 58 and a least a portion of a bottom side of the core extension 66. In other cases, the bottom heat plate 62 may be confined within the bottom side of the heat spreader 58 (not shown). The heat spreader 58 may be coupled to the core extension 66 via the adhesive 64. The core extension 66 may be formed from a same material as the substrate core 44.

Further, the system 40 also includes a wire-bonding die 68, a printed circuit board (PCB) 70, and a system heat sink 72. The wire-bonding die 68 that includes a wire-bonding die body 74 and wires 76 is mounted over and thermally coupled to the heat spreader 58. The wire-bonding die body 74 has a top surface and a bottom surface that is opposite the top surface of the wire-bonding die body 74 and in contact with the top heat plate 60. The top heat plate 60 may be a ground plate. Each wire 76 extends from the top surface of the wire-bonding die body 74 towards a corresponding connecting structure 46.

The system heat sink 72 has a top surface that includes a first surface portion and a second surface portion surrounding the first surface portion SP1 and a second surface portion SP2 surrounded by the first surface portion SP1 of the system heat sink 72. The PCB 70 is mounted over the first surface portion SP1 of the system heat sink 72. An adhesive (not shown) may be used to attach the PCB 70 to the first surface portion SP1 of the system heat sink 72. The PCB 70 has a thickness between 0 and 0.65 cm, where 0.01 cm to 0.4 cm is a desirable thickness range. The extension portion EP of the heat spreader 58 and the core extension 66 extend into an opening in the PCB 70, and the extension portion EP of the heat spreader 58 is thermally coupled to the second surface portion SP2 of the system heat sink 72. Herein, at least a portion of the PCB 70 resides between the bottom surface of the substrate core 44 and the first surface portion SP1 of the system heat sink 72. The bottom heat plate 62 is in contact with the second surface portion SP2 of the system heat sink 72. In this embodiment, the first surface portion SP1 of the system heat sink 72 and the second surface portion SP2 of the system heat sink 72 are coplanar. The system heat sink 72 may be formed from an un-machined flat metal plate/sheet or a ceramic plate/sheet.

Figure 3A:
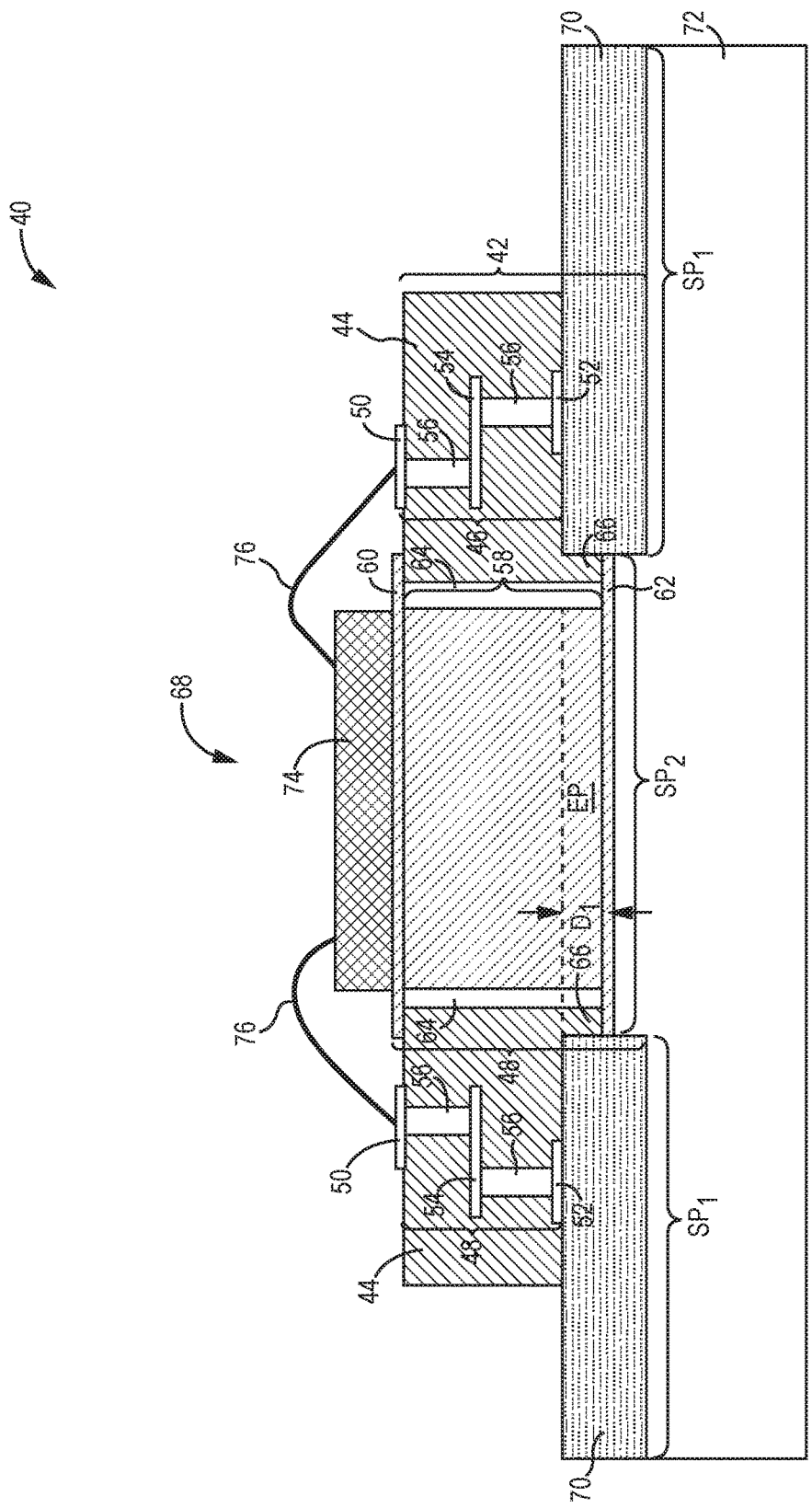
FIGS. 3A-3B show a system including an exemplary substrate according to one embodiment of the present disclosure.
Figure 3B:
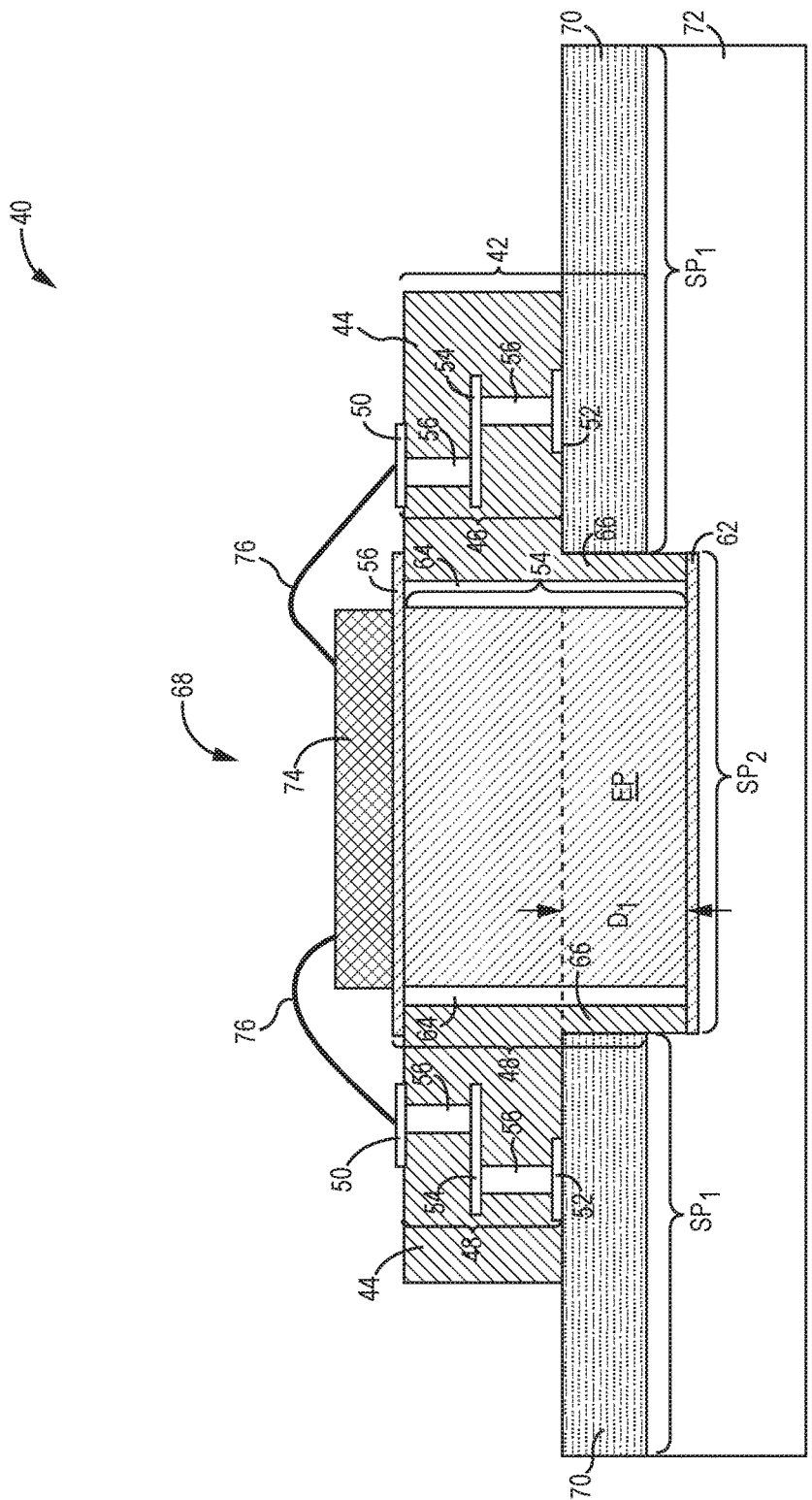

In some applications, the first surface portion SP1 of the system heat sink 72 resides along a first plane and the second surface portion SP2 of the system heat sink 72 resides along a second plane that is different than the first plane. As shown in FIG. 3A, a portion of the system heat sink 72 extends into the opening in the PCB 70 such that the second surface portion SP2 of the system heat sink 72 is above the first surface portion SP1 of the system heat sink 72. As shown in FIG. 3B, the extension portion EP of the heat spreader 58 and the core extension 66 extend into the system heat sink 72 such that the second surface portion SP2 of the system heat sink 72 is below the first surface portion SP1 of the system heat sink 72.

Notice that, whether or not the first surface portion SP1 of the system heat sink 72 is coplanar with the second surface portion SP2 of the system heat sink 72, the extension portion EP of the heat spreader 58 is always thermally coupled to the second surface portion SP2 of the system heat sink 72, and the bottom heat plate 62 is always in contact with the second surface portion SP2 of the system heat sink 72. The distance D1 of the extension portion EP of the heat spreader 58 accommodates the position of the second surface portion SP2 of the system heat sink 72. If the first surface portion SP1 of the system heat sink 72 is coplanar with the second surface portion SP2 of the system heat sink 72, the distance D1 of the extension portion EP of the heat spreader 58 is essentially the same as the thickness of the PCB 70 (deducting a thin thickness of the bottom heat plate 62 and adding a thickness of the adhesive that may be used to attach the PCB 70 to the system heat sink 72). If the second surface portion SP2 of the system heat sink 72 is above the first surface portion SP1 of the system heat sink 72 and below the top surface of the PCB 70, the distance D1 of the extension portion EP of the heat spreader 58 has a smaller value than the thickness of the PCB 70. In some specific cases, if the second surface portion SP2 of the system heat sink 72 is above the top surface of the PCB 70, the distance D1 of the extension portion EP of the heat spreader 58 will have a negative value. And if the second surface portion SP2 of the system heat sink 72 is below the first surface portion SP1 of the system heat sink 72, the distance D1 of the extension portion EP of the heat spreader 58 will have a larger value than the thickness of the PCB 70. The distance D1 of the extension portion EP of the heat spreader 58 may be varied by adjusting a thickness of the heat spreader 58, a thickness of the substrate core 44, or the position of the heat spreader 58 relative to the substrate core 44. Herein, the distance D1 of the extension portion EP of the heat spreader 58 may be between −0.3 cm and 0.65 cm.

Figure 4:
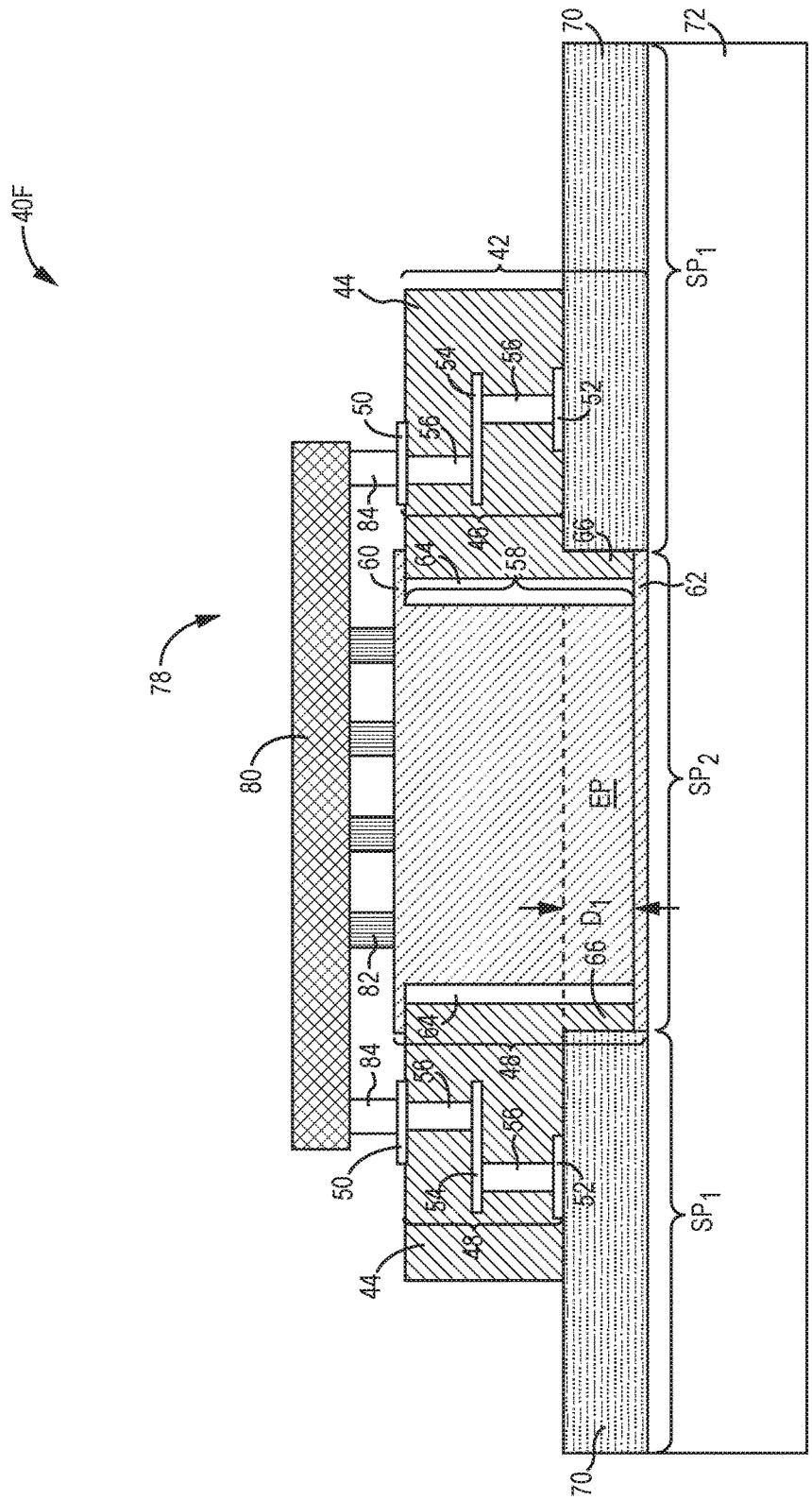
FIG. 4 shows an alternative system including an exemplary substrate according to one embodiment of the present disclosure.

It will be clear to those skilled in the art that it is also possible to mount a flip-chip die instead of a wire-bonding die over the substrate 42. As shown in FIG. 4, a system 40F includes a flip-chip die 78 mounted over the substrate 42. The flip-chip die 78 includes a flip-chip die body 80, first interconnects 82 (in FIG. 4, only one first interconnect 82 is labeled with a reference number to avoid drawing clutter), and second interconnects 84. The first interconnects 82 extend from a bottom surface of the flip-chip die body 80 towards the heat spreader structure 48. The first interconnects 82 are in contact with the top heat plate 60 and thermally coupled to the heat spreader 58. The top heat plate 60 may be a ground plate. Herein, the first interconnects 82 are used as ground paths and/or heat paths. Each second interconnect 84 extends from the bottom surface of the flip-chip die body 80 towards a corresponding connecting structure 46.

Those skilled in the art will recognize improvements and modifications to the preferred embodiments of the present disclosure. All such improvements and modifications are considered within the scope of the concepts disclosed herein and the claims that follow.

What is claimed is:
1. An apparatus comprising:
a substrate core having a top surface and a bottom surface opposite the top surface of the substrate core;

at least one connecting structure extending through the substrate core from the top surface of the substrate core to the bottom surface of the substrate core;

a heat spreader extending through the substrate core from the top surface of the substrate core to a bottom level that is below the bottom surface of the substrate core; and a core extension that extends from the bottom surface of the substrate core towards the bottom level and surrounds an extension portion of the heat spreader that extends below the bottom surface of the substrate core, wherein the bottom surface of the substrate core surrounds the core extension.

2. The apparatus of claim 1 further comprising a system heat sink, which has a top surface including a first surface portion and a second surface portion, and a printed circuit board (PCB) mounted over the first surface portion of the system heat sink, wherein the extension portion of the heat spreader and the core extension extend into an opening in the PCB, and the extension portion of the heat spreader is thermally coupled to the second surface portion of the system heat sink such that at least a portion of the PCB resides between the bottom surface of the substrate core and the first surface portion of the system heat sink.

3. The apparatus of claim 1 further comprising a bottom heat plate coupled to a bottom side of the heat spreader.

4. The apparatus of claim 3 wherein the bottom heat plate covers the bottom side of the heat spreader and a least a portion of a bottom side of the core extension.

5. The apparatus of claim 1 further comprising a top heat plate coupled to a top side of the heat spreader.

6. The apparatus of claim 5 wherein the top heat plate covers the top side of the heat spreader and at least a portion of the top surface of the substrate core.

7. The apparatus of claim 5 wherein the top heat plate is a ground plate.

8. The apparatus of claim 1 further comprising a bottom heat plate coupled to a bottom side of the heat spreader and a top heat plate coupled to a top side of the heat spreader.

9. An apparatus comprising:
a substrate core having a top surface and a bottom surface opposite the top surface of the substrate core;
at least one connecting structure extending through the substrate core from the top surface of the substrate core to the bottom surface of the substrate core;
a heat spreader extending through the substrate core from the top surface of the substrate core to a bottom level that is below the bottom surface of the substrate core;
a system heat sink, which has a top surface including a first surface portion and a second surface portion; and
a PCB mounted over the first surface portion of the system heat sink, wherein an extension portion of the heat spreader that extends below the bottom surface of the substrate core extends into an opening in the PCB and is thermally coupled to the second surface portion of the system heat sink such that at least a portion of the PCB resides between the bottom surface of the substrate core and the first surface portion of the system heat sink.

10. The apparatus of claim 9 wherein the first surface portion of the system heat sink and the second surface portion of the system heat sink are coplanar.

11. The apparatus of claim 10 wherein the system heat sink is formed from a flat metal plate or sheet.

12. The apparatus of claim 10 wherein the system heat sink is formed from a flat ceramic plate or sheet.

13. The apparatus of claim 9 wherein the first surface portion of the system heat sink resides along a first plane and the second surface portion of the system heat sink resides along a second plane that is different than the first plane.

14. The apparatus of claim 9 wherein the PCB has a thickness between 0 and 0.65 cm.

15. The apparatus of claim 1 wherein the heat spreader is coupled with the substrate core via an adhesive.

16. The apparatus of claim 1 wherein the heat spreader is directly coupled with the substrate core.

17. The apparatus of claim 1 wherein the heat spreader is formed from metallic or ceramic materials.

18. The apparatus of claim 1 wherein the extension portion of the heat spreader extends below the bottom surface of the substrate core by a distance between 0.01 cm and 0.4 cm.

19. The apparatus of claim 1 further comprising a die mounted over and thermally coupled to the heat spreader.

20. The apparatus of claim 19 wherein the die is a wire-bonding die including a wire-bonding die body and at least one wire, wherein:
the wire-bonding die body has a top surface and a bottom surface that is opposite the top surface of the wire-bonding die body and coupled to the heat spreader; and
the at least one wire extends from the top surface of the wire-bonding die body towards the at least one connecting structure.

21. The apparatus of claim 19 wherein the die is a flip-chip die including a flip-chip die body, at least one first interconnect, and at least one second interconnect, wherein:
the at least one first interconnect extends from a bottom surface of the flip-chip die body towards the heat spreader; and
the at least one second interconnect extends from the bottom surface of the flip-chip die body towards the at least one connecting structure.

22. An apparatus comprising:
a system heat sink, which has a top surface including a first surface portion and a second surface portion;
a PCB mounted over the first surface portion of the system heat sink;
a substrate including a substrate core, at least one connecting structure, and a heat spreader, wherein:
the substrate core has a top surface and a bottom surface opposite the top surface of the substrate core;
the at least one connecting structure extends through the substrate core from the top surface of the substrate core to the bottom surface of the substrate core; and
the heat spreader extends through the substrate core and into an opening in the PCB, wherein the heat spreader is thermally coupled to the second surface portion of the system heat sink such that a least a portion of the PCB resides between the bottom surface of the substrate core and the first surface portion of the system heat sink; and
a die mounted over and thermally coupled to the heat spreader.

* * * * *